(12) United States Patent
Hersee et al.

(10) Patent No.: US 8,343,823 B2
(45) Date of Patent: Jan. 1, 2013

(54) NANOWIRE AND LARGER GAN BASED HEMTS

(75) Inventors: Stephen D. Hersee, Albuquerque, NM (US); Xin Wang, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 13/461,331

(22) Filed: May 1, 2012

(65) Prior Publication Data

US 2012/0225526 A1 Sep. 6, 2012

Related U.S. Application Data

(62) Division of application No. 12/246,044, filed on Oct. 6, 2008, now Pat. No. 8,188,513.

(60) Provisional application No. 60/977,411, filed on Oct. 4, 2007.

(51) Int. Cl.
*H01L 21/338* (2006.01)

(52) U.S. Cl. ............... 438/172; 257/194; 257/E21.403; 977/762

(58) Field of Classification Search .............. 438/167, 438/172, 41, 46, 479; 257/194, E29.246, 257/E29.248, E21.403
See application file for complete search history.

(56) References Cited

U.S. PATENT DOCUMENTS

| 5,296,395 | A | 3/1994 | Khan et al. |
| 2002/0094002 | A1 | 7/2002 | Amano et al. |
| 2003/0201459 | A1 | 10/2003 | Sheppard et al. |
| 2006/0081886 | A1 | 4/2006 | Mostarshed et al. |

OTHER PUBLICATIONS

Stephen D. Hersee, "Pulsed Growth of Catalyst-Free Growth of GaN Nanowires and Application in Group III Nitride Semiconductor Bulk Material", U.S. Appl. No. 11/684,264, filed Mar. 9, 2007.

*Primary Examiner* — Julio J Maldonado
*Assistant Examiner* — Sonya D McCall Shepard
(74) *Attorney, Agent, or Firm* — MH2 Technology Law Group, LLP

(57) ABSTRACT

Nanowire and larger, post-based HEMTs, arrays of such HEMTs, and methods for their manufacture are provided. In one embodiment, a HEMT can include a III-N based core-shell structure including a core member (e.g., GaN), a shell member (e.g., AlGaN) surrounding a length of the core member and a two-dimensional electron gas (2-DEG) at the interface therebetween. The core member including a nanowire and/or a post can be disposed over a doped buffer layer and a gate material can be disposed around a portion of the shell member. Exemplary methods for making the nanowire HEMTs and arrays of nanowire HEMTs can include epitaxially forming nanowire(s) and epitaxially forming a shell member from each formed nanowire. Exemplary methods for making the post HEMTs and arrays of post HEMTs can include etching a III-N layer to form III-N post(s) followed by formation of the shell member(s).

9 Claims, 3 Drawing Sheets

NANOWIRE AND LARGER GAN BASED HEMTS

RELATED APPLICATIONS

This application is a divisional application of U.S. patent application Ser. No. 12/246,044 filed Oct. 6, 2008, and claims priority from U.S. Provisional Patent Application Ser. No. 60/977,411, filed Oct. 4, 2007, which is hereby incorporated by reference in its entirety.

GOVERNMENT RIGHTS

This invention was made with government support under Contract No. W911QX-06-C-0090 awarded by the Defense Advanced Research Projects Agency (DARPA)/Army Research Office. The government has certain rights in the invention.

FIELD OF THE INVENTION

This invention relates generally to high electron mobility transistors (HEMTs) and, more particularly, to nanowire and larger, post-based HEMTs.

BACKGROUND OF THE INVENTION

High electron mobility transistors (HEMTs) are common types of solid state transistors that are fabricated from semiconductor materials such as indium phosphide (InP) or gallium arsenide (GaAs). For example, GaAs has become the standard for signal amplification in civil and military radar, handset cellular, and satellite communications. GaAs has a higher electron mobility and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing have focused interest on the development of gallium nitride (GaN) and aluminum gallium nitride (AlGaN) semiconductor materials to form planar AlGaN/GaN based HEMT devices. These devices can generate large amounts of power because of their unique combination of material characteristics including high breakdown fields, wide bandgaps (3.36 eV for GaN at room temperature), large conduction band offset, and high saturated electron drift velocity.

For example, a conventional 1.7 mm×1.7 mm GaN based HEMT can generate 2.2 W/mm of power and have a noise figure of less than 1 dB for the 0.2 to 8 GHz frequency range. These conventional GaN based HEMTs, however, suffer from defect density problems and self-heating issues.

Thus, there is a need to overcome these and other problems of the prior art and to provide GaN nanowire based and larger, GaN post-based HEMTs.

SUMMARY OF THE INVENTION

According to various embodiments, the present teachings include a high electron mobility transistor (HEMT). The HEMT can include a III-N based core-shell structure having, e.g., a core member, a shell member surrounding a length of the core member and a two-dimensional electron gas (2-DEG) at the interface therebetween. The core member can be disposed over a portion of the doped buffer layer and a gate material can be disposed around a portion of the shell member and over another portion of the doped buffer layer. Various embodiments can also include HEMT transistor arrays having a plurality of core members and a plurality of related HEMTs. The core member can include, e.g., III-N based nanowire and/or III-N based larger post.

According to various embodiments, the present teachings also include a method for making a HEMT. In this method, a III-N based nanowire can be epitaxially grown from a doped buffer layer and through a growth mask. A shell member can then be formed over another portion of the doped buffer layer and surrounding a length of the III-N based nanowire for forming a two-dimensional electron gas (2-DEG) at the interface between the III-N based nanowire and the shell member. Surrounding a portion of the shell member and over an additional portion of the doped buffer layer, a first dielectric layer can then be formed, followed by the formation of a metal gate surrounding a second portion of the shell member and over the first dielectric layer. Surrounding a third portion of the shell member and over a portion of the metal gate, a second dielectric layer can be formed. In various embodiments, a HEMT transistor array can also be formed having a plurality of III-N based nanowires and a plurality of related HEMTs.

According to various embodiments, the present teachings further include a method for forming a HEMT, where a III-N based post having a minor cross-sectional dimension of greater than about 250 nm can be formed over a doped buffer layer. A shell member can then be formed over another portion of the doped buffer layer and surrounding a length of the formed III-N based post for forming a two-dimensional electron gas (2-DEG) at an interface between the III-N based post and the shell member. Surrounding a portion of the shell member and over an additional portion of the doped buffer layer, a first dielectric layer can then be formed, followed by the formation of a metal gate over the first dielectric layer and surrounding a second portion of the shell member. Surrounding a third portion of the shell member and over a portion of the metal gate, a second dielectric layer can be formed. In various embodiments, a HEMT transistor array can also be formed having a plurality of III-N based posts and a plurality of HEMTs.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
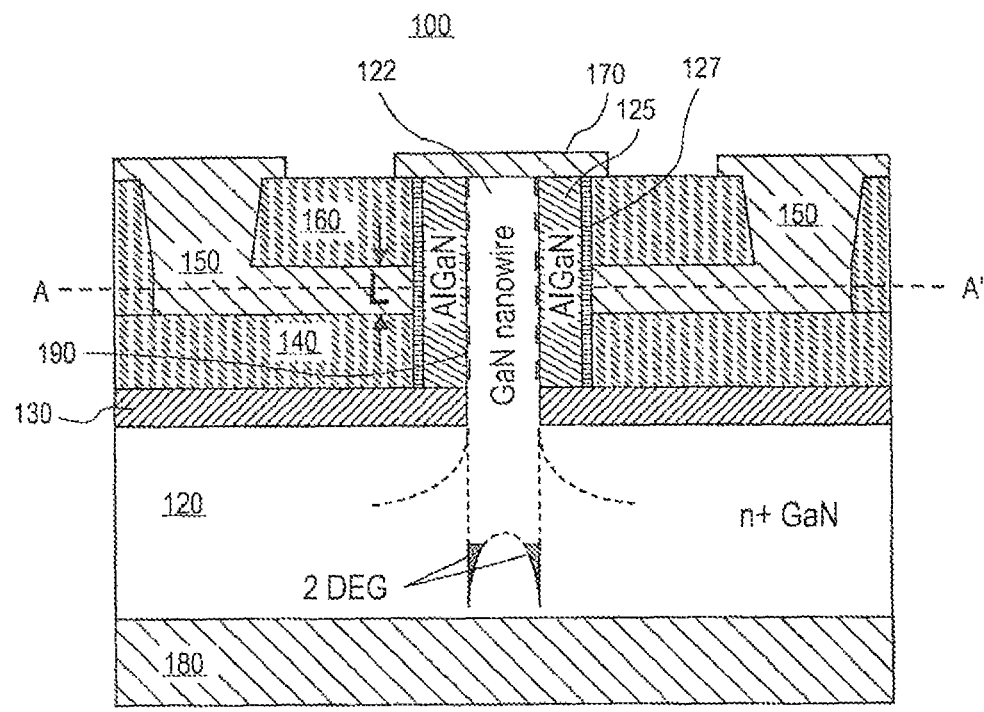
FIG. 1 depicts an exemplary nanowire-based HEMT in accordance with the present teachings.

Reference will now be made in detail to exemplary embodiments of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide nanowire-based and/or larger, post-based HEMTs, arrays of such HEMTs, and methods for their manufacture. In one embodiment, a HEMT can include a III-N based core-shell structure including a core member (e.g., GaN), a shell member (e.g., AlGaN) surrounding a length of the core member and a two-dimensional electron gas (2-DEG) at an interface therebetween. The core member including a nanowire and/or a post can be disposed over a doped buffer layer and a gate material can be disposed around a portion of the shell member and over a portion of the doped buffer layer. Exemplary methods for making the nanowire HEMTs and arrays of nanowire HEMTs can include epitaxially forming a nanowire core member through a selective growth mask using a selective growth followed by a pulsed growth; and epitaxially forming a shell member from the formed nanowire core member. Exemplary methods for making the post HEMTs and arrays of post HEMTs can include etching a III-N layer to form one or more III-N posts, with each III-N post being used as a core member, followed by formation of a shell member from each III-N post.

In various embodiments, the exemplary III-N nanowire-based and III-N larger, post-based HEMTs disclosed herein can provide performance improvements over conventional HEMTs. The exemplary HEMTs can contain fewer or no dislocations, which increases carrier mobility and reduces self-heating issues. This is because the nanowire-based and larger, post-based HEMT devices can offer large surface areas as compared with the device "footprint", which efficiently heatsink the HEMT device, especially when fluid-cooling is applied to the device exterior.

In addition, the nanowire and/or larger, post-based HEMT devices can be fabricated to provide an ultra-short gate length that allows operation at high frequencies. For example, the fabricated HEMT device can have a gate length defined by the thickness of the gate metal (or other conductive gate material, ignoring parasitic effects), which can be easily made in sub-micron (e.g., less than about 1 micron) and even down to the sub-tenth-micron range. The gate metal (or other conductive gate material) can completely surround the two-dimensional electron gas (2DEG) of the HEMT device to allow for good control of the channel current by the gate and therefore a high transconductance.

In various embodiments, the III-N nanowire and/or the III-N larger, post can be used as the core member, which can include various cross-sectional shapes, such as, for example, a polygon, a rectangle, a square, an oval, and/or a circle. In an embodiment, the nanowire and/or post core member can have a hexagonal cross-sectional shape.

In various embodiments, the nanowire core member can have at least one minor dimension, for example, one of the cross-sectional dimensions such as width or diameter, of less than or equal to about 250 nm, while the larger, post-based core member can have a minor cross-sectional dimension of greater than about 250 nm. In various embodiments, the core member can also have an aspect ratio of about 100 or higher.

In various embodiments, the disclosed HEMTs can exploit exemplary III-N nanowires with high-quality (i.e., defect free) and with a precise control of the position, orientation, cross-sectional features, length and/or the crystallinity of each nanowire, as described in the related U.S. patent application Ser. No. 11/684,264, entitled "Pulsed Growth of GaN Nanowires and Applications in Group III Nitride Semiconductor Substrate Materials and Devices," which is hereby incorporated by reference in its entirety. Other disclosed embodiments can include uniform arrays of the group III-N nanowires and the core-shell growth on the sidewalls of each nanowire since each nanowire can provide nonpolar sidewalls. For example, the group III-N nanowire can have an exemplary hexagonal cross-section with sidewall facets bounded the nanowire as members of the {1100} family.

For ease of illustration, the application herein will be described with reference to devices and manufacturing processes using gallium nitride (GaN) based III-N HEMT devices, although other one or more III-N materials including, e.g., AlN, InN, InGaN, AlInGaN and/or AlGaN, can also be employed for forming related structures and devices.

FIG. 1 depicts an exemplary nanowire-based HEMT device 100 in accordance with the present teachings. It should be readily apparent to one of ordinary skill in the art that the device design 100 depicted in FIG. 1 represents a generalized schematic illustration and that other materials/layers/members can be added or existing materials/layers/members can be removed or modified. Although this figure depicts a single nanowire-based device, one of ordinary skill in the art will understand that large arrays of these devices can be fabricated simultaneously.

For example, as shown in FIG. 1, the HEMT device 100 can include a doped GaN buffer layer 120, a GaN nanowire 122, a shell member including a first shell region 125 and a second shell region 127, a selective growth mask 130, a first dielectric layer 140, a gate material 150, a second dielectric layer 160, a source contact 170 and a drain contact 180.

In various embodiments, the material, structure, and/or formation of each of the buffer layer 120, the nanowire 122, the shell member (125/127), and the growth mask 130 can be similar to that described in U.S. patent application Ser. No. 11/684,264.

For example, the doped GaN buffer layer 120 can be disposed over the selective growth mask 130 to form the GaN nanowire 122. The doped GaN buffer layer 120 can be a planar semiconductor film epitaxially formed by, for example, standard MOCVD (i.e., metalorganic chemical vapour deposition) and doped with either an n-type or a p-type dopant. Various dopants known to one of ordinary skill in the art can be used. The selective growth mask 130 can be made of any dielectric material and formed over the doped GaN buffer layer 120. The GaN nanowire 122 can be formed to connect to and extend from the doped GaN buffer layer 120 through the selective growth mask 130, wherein the nanowire 122 can be isolated by the selective growth mask 130.

Still in this example, the GaN nanowire 122 as a core member can be grown using an epitaxial selective growth followed by an epitaxial pulsed growth (e.g., MOCVD) through the selective growth mask 130 and can then be enveloped, shelled, or surrounded in a lengthwise manner by the shell member (125/127) to provide a III-N based core-shell structure. The shell member (125/127) can be formed over the selective growth mask 130 and over the doped buffer layer 120. The shell member can have a thickness of about 0.1 μm to about 0.3 μm and can be formed of, for example, GaN, AlN, InN, InGaN, AlInGaN and/or AlGaN.

In various embodiments, the shell member can be formed using various III-V alloys, for example, the first shell region 125 on the nanowire 122 can be made of AlGaN, while the second shell region 127 can be made of, e.g., GaN. In other embodiments, the shell member can be formed using one material, e.g., AlGaN, with the first and second shell regions 125 and 127 having different doping levels or different compositions. For example, the shell region 125 on the nanowire 122 can be n-doped AlGaN and the shell region 127 can be undoped AlGaN. In the exemplary embodiment, the AlGaN shell member can be formed, for example, by adding TMAl (trimethyl aluminum) to the MOCVD gas-mixture including, for example, trimethylgallium (TMGa), and ammonia ($NH_3$) during the pulsed growth.

In various embodiments, the first AlGaN shell region 125 has a wider bandgap than the GaN nanowire 122 and this discontinuity in energy band gaps can result in a free charge transfer from the wider band gap to the lower band gap material. A charge can accumulate in the triangular quantum well that is created at the interface 190 between the nanowire core 122 and the first shell region 125 (e.g., AlGaN/GaN interface) and can create a two dimensional electron gas. (2-DEG), which allows current to flow between the source and drain contacts 170/180.

Referring back to FIG. 1, the exemplary HEMT 100 can further include the first dielectric layer 140 and the second dielectric layer 160 bounding the gate material 150, e.g., gate metal. The first and second dielectric layers 140/160 and the gate material 150 can be deposited on the selective growth mask 130 and connected around the sidewalls of the second shell region 127 in a lengthwise manner. For example, the first dielectric layer 140 can be formed surrounding a first portion of the shell member, specifically the shell region 127. The gate metal can then be formed over the first dielectric layer 140 and surrounding a second portion of the sidewall of the shell region 127. The second dielectric layer 160 can then be formed over a portion of the gate metal and surrounding a third portion of the sidewall of the shell region 127.

In various embodiments, the first and second dielectric layers 140/160 can be formed by any dielectric material for electrical isolation, such as, for example, silicon oxide ($SiO_2$), silicon nitride ($Si_3N_4$), silicon on/nitride (SiON), or other insulating materials. In some embodiments, the dielectric layers can include a curable dielectric and can be formed by, for example, chemical vapor deposition (CVD) or spin-on techniques.

During formation, the exemplary gate metal (e.g., 150) can be deposited after a first layer of spin-on, curable dielectric has been deposited (e.g., the first dielectric layer 140). The gate metal can then be buried under a second layer of spin-on dielectric (e.g., the second dielectric layer 140). The channel length (L) of the HEMT (ignoring parasitics) can be defined by the thickness of the gate metal, and this can be controlled down to be about 100 Å or less. In various embodiments, the gate metal can be formed of, e.g., titanium, platinum, chromium, nickel, alloys of titanium and tungsten, and/or platinum silicide.

Figure 1A:
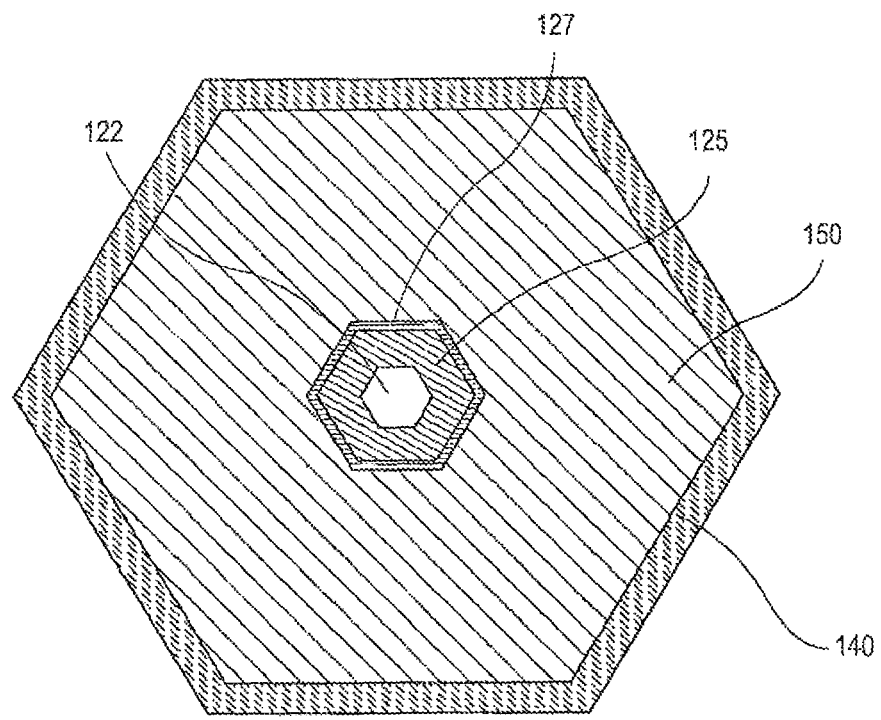
FIG. 1A depicts an exemplary cross-sectional view along the direction perpendicular to the plane A-A' for the device shown in FIG. 1 in accordance with the present teachings.

In various embodiments, the unique geometry of the core member, i.e., the nanowire or the larger post, and the formed HEMT device can provide many advantages for the device operation. For example, FIG. 1A depicts an exemplary cross-sectional view along the direction perpendicular to the plane A-A' for the device 100 shown in FIG. 1. As shown, the exemplary core member, the GaN nanowire 122, can include a hexagonal nanowire surrounded by the exemplary AlGaN shell member (125/127) having the interface 190 therebetween to allow the 2-DEG developing on each of the 6-sidewall facets of the hexagonal nanowire and the developed 2-DEG can therefore completely surround the hexagonal nanowire. The extensive, enveloping nature of this 2-DEG region suggests that a high sheet concentration of accumulated carriers can occur. In addition, the gate metal 150 can, e.g., completely surround the nanowire. HEMT, which provides an efficient control of the 2-DEG channel current resulting in a very high transconductance, e.g., at high frequencies.

Figure 1B:
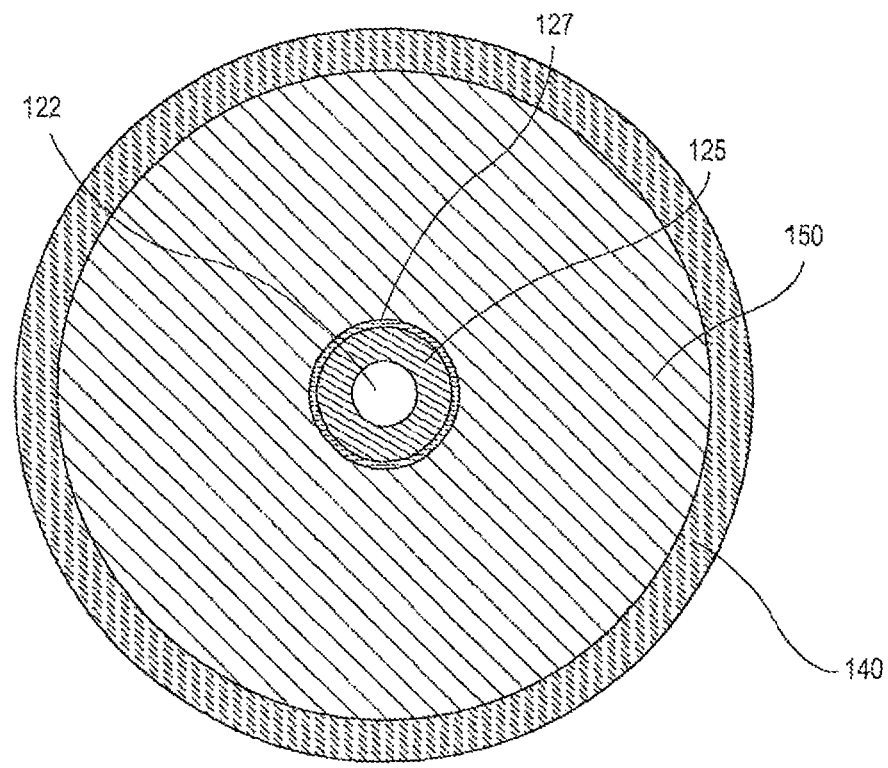
FIG. 1B depicts another exemplary cross-sectional view along the direction perpendicular to the plane A-A' for the device shown in FIG. 1 in accordance with the present teachings.

Other unique geometries, such as, for example, rectangles, squares, ovals, or circles, of the core member and/or the related HEMT can also be utilized according to various embodiments. FIG. 1B depicts another exemplary cross sectional view along the direction perpendicular to the plane A-A' for the device 100 shown in FIG. 1, wherein the exemplary nanowire core member 122 can have a circular cross section. This exemplary circular nanowire can be surrounded by the shell member (125/127) having 2-DEG developed at the core-shell interface 190 around the circular nanowire. The gate metal 150 can also surround the nanowire HEMT to provide an efficient control of the 2-DEG channel current and resulting in a very high transconductance at high frequencies.

Referring back to FIG. 1, the approximate conduction band diagram can be superimposed on the lower part of the figure to show the location of the triangular quantum well and 2-DEG regions. Source and drain contacts 170 and 180 can then be made by conventional procedures known to one of ordinary skill in the art. For example, the source contact 170 can be formed on the core-shell structure (including the GaN nanowire 122, and the shell member including the shell regions 125 and 127), while the drain contacts 180 can be formed on the doped GaN layer 120 opposite to the growth mask 130. In various embodiments, the source and drain contacts 170/180 can include conductive structures formed from metals such as titanium (Ti), aluminum (Al), platinum (Pt), nickel (Ni) or gold (Au) in a number of multi-layered combinations such as AlM/Pt/Au, Ni/Au, Ti/Al, Ti/Au, Ti/Al/Ti/Au, Ti/Al/Au, Al or Au using techniques known to one of ordinary skill in the art.

Figure 2:
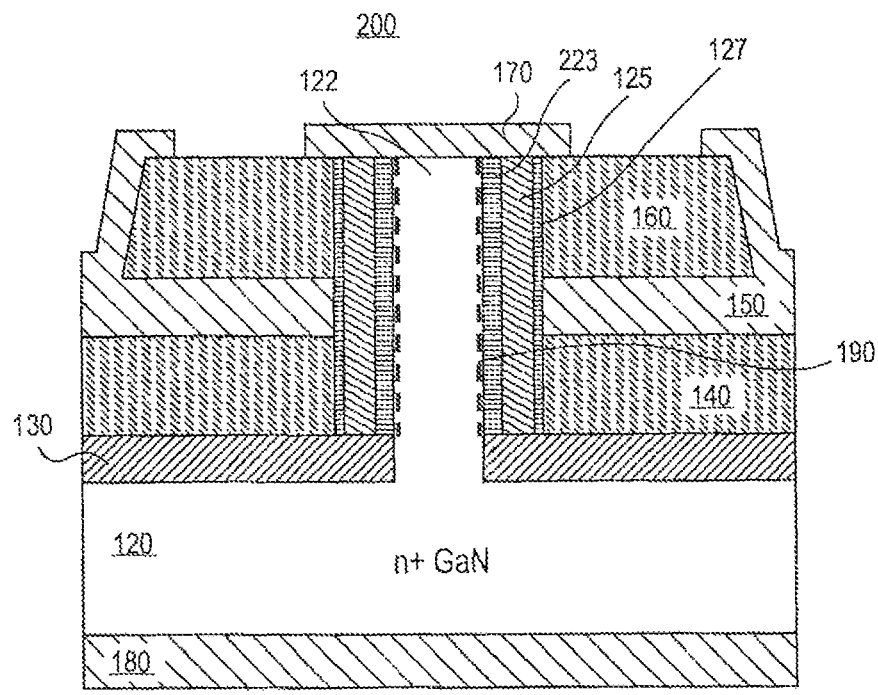
FIG. 2 depicts another exemplary nanowire-based HEMT in accordance with the present teachings.

Various nanowire based HEMT devices can be formed according to various embodiments. For example, FIG. 2 depicts another exemplary nanowire-based HEMT device 200 in accordance with the present teachings. As shown, the device 200 can have a different shell structure/member as compared with the HEMT device 100 shown in FIG. 1. For example, the device 200 can further include a barrier shell region 223 formed from the sidewalls of the GaN nanowire 122 with the shell regions 125 and 127 formed on the barrier shell region 223. In an exemplary embodiment, the shell regions 223, 125 and 127 can be formed by the core-shell growth method as described for the device 100 of FIG. 1 using a material of, e.g., AlGaN, wherein the shell region 223 can be made undoped, the shell region 125 n-type, and the shell region 127 n-type. Various dopants known to one of ordinary skill in the art can be used. In other embodiments, the shell member including regions 223, 125 and 127 can be formed using various III-N alloys and dopants as desired.

In various embodiments, individual HEMT devices may be a low power device. Depending on the total power required, one or more arrays of a number of HEMT devices (e.g., nanowire-based and/or larger, post-based) can be formed to provide a high total output power suitable for use in a variety of applications. An exemplary HEMT array 300 according to the present teachings is depicted in FIG. 3.

For example, utilizing the teachings of U.S. patent application Ser. No. 11/684,264, the nanowire process can be used to create a massive, uniform array of precision nanowires. As shown in FIG. 3, the exemplary nanowire HEMT array 300 can include a plurality of nanowire-based HEMTs, e.g., the HEMT devices 200 shown in FIG. 2, having a plurality of nanowires (e.g., nanowire 122 in FIGS. 1-2), with each surrounded along its length by a shell structure/member to form each nanowire HEMT. The shell member around the nanowires can allow for large 2-DEG accumulation and a very short gate length.

Figure 3:
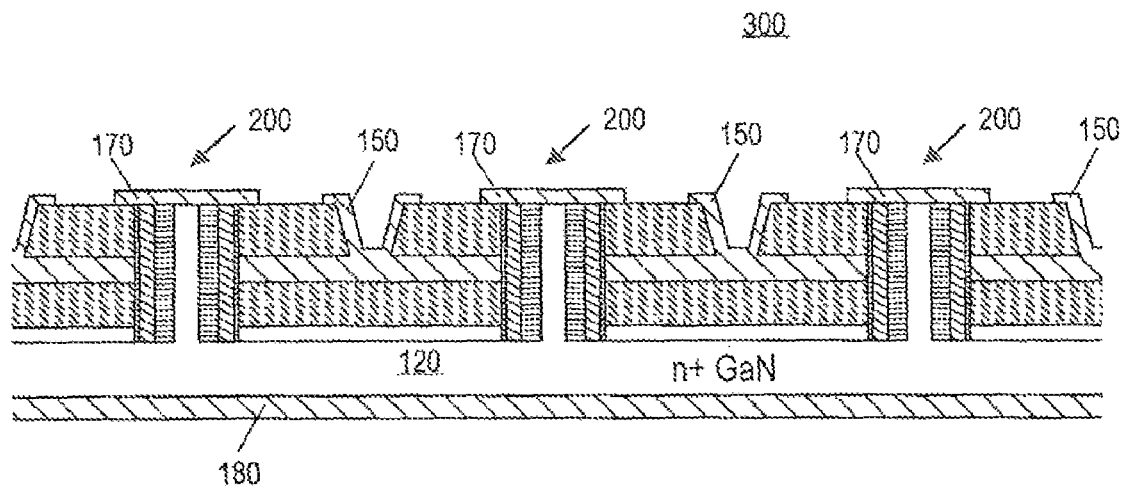
FIG. 3 depicts an exemplary HEMT array in accordance with the present teachings.

FIG. 3 utilizes the device 200 to form the HEMT arrays as an example. One of ordinary skill in the art will understand that any other disclosed HEMT devices, nanowire-based and/or larger, post-based, including devices shown in FIGS. 1-2 or FIG. 4 (see below), can be used to form the HEMT arrays for certain applications. As shown in FIG. 3, the exemplary HEMT array 300 can have a common drain contact 180 and a common doped GaN buffer layer; and each HEMT device can have a source (emitter) contact 170 and a gate (base) contact 150.

Figure 4:
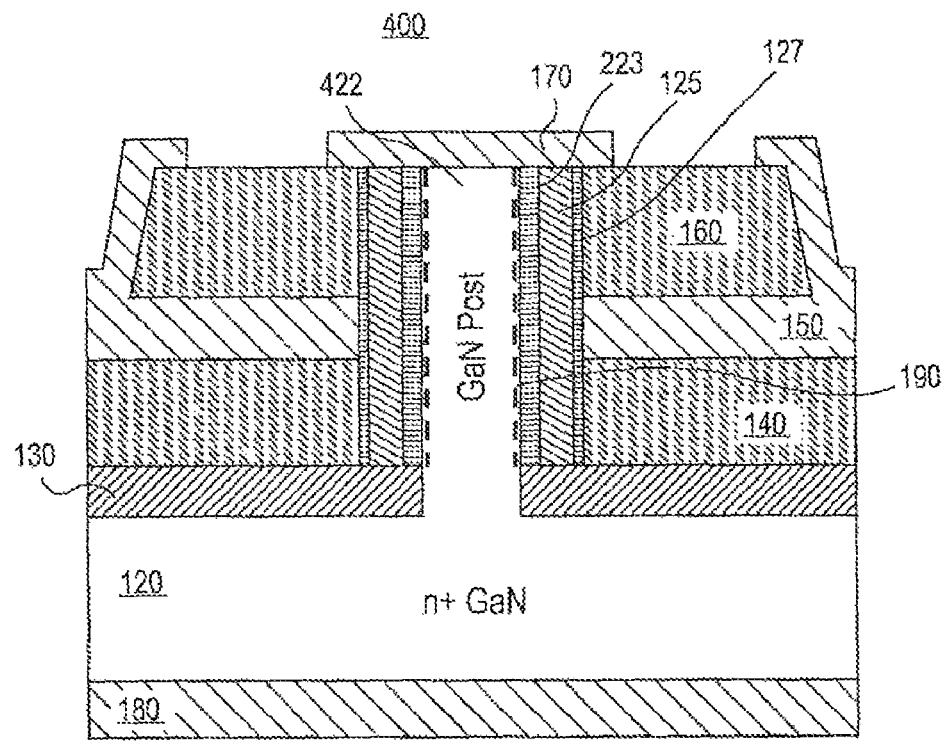
FIG. 4 depicts an exemplary post-based HEMT in accordance with the present teachings.

According to various other embodiments, an exemplary larger, post-based HEMT design is illustrated in FIG. 4 including a GaN post 422 as opposed to the GaN nanowire used in FIGS. 1-3. The GaN post 422 can be, for example, larger in diameter than the disclosed nanowires, e.g., more than about 250 nm. In various embodiments, the GaN posts 422 can be millimeters in diameter. Although this figure shows a single larger, post-based device, one of ordinary skill in the art will understand that large arrays of these devices can be fabricated simultaneously.

In various embodiments, the GaN post 422 in FIG. 4 can be formed, for example, by top down etching a GaN layer disposed on the doped GaN buffer layer 120 to form one or more GaN posts 422 on the doped GaN buffer layer 120 with each GaN post having a desired length and cross-sectional shape. For example, the GaN post 422 can have a desired cross-sectional shape, such as, for example, circular, polygonal, rectangular, square, oval, etc. In various embodiments, the growth mask 130 can either be left in place, or removed from the device 400 using differential etching processes known to one of ordinary skill in the art. The GaN post 422 can then be enveloped by the shell structure/member to surround the post in a lengthwise manner. The shell structure/member including shell regions 125, 127 and/or 223 can be formed of one or more materials chosen from, for example, GaN, AlN, InN, InGaN, AlInGaN or AlGaN. The shell member can have a thickness of about 0.1 μm to about 0.3 μm.

As disclosed herein, the exemplary HEMT 400 can further include a first dielectric layer 140 and a second dielectric layer 160 bounding a gate metal 150. In various embodiments, the exemplary shell member (233/125/127), the first and second dielectric layers (140/160), and the gate metal (150) can be similar to those described in FIGS. 1-3. For example, the shell member of the HEMT 400 can include only the shell regions 125 and 127 as described in FIG. 1 or can include the shell regions 223/125/127 as described in FIG. 2.

In various embodiments, the larger GaN post 422 can also provide unique geometries for the core member and the formed HEMT device to provide many advantages for the device operation. As similarly described in FIGS. 1A-1B for nanowire core member, each exemplary larger post core member can also include a hexagonal post or a circular post surrounded by the shell member having the interface therebetween to allow the 2-DEG developing on sidewall facets of the hexagonal or circular GaN post and the developed 2-DEG can therefore completely surround the exemplary larger GaN post. Likewise, the gate metal can also surround the larger post-based HEMT to provide an efficient control of the 2-DEG channel current and resulting in a very high transconductance, e.g., at high frequencies.

Various embodiments can also include a method for making a larger, post-based HEMT. The method can include, e.g., first forming the III-N based (e.g., GaN) post over the doped buffer layer with the III-N based post having a minor dimension greater than about 250 nm. Surrounding the length of the III-N based post, a shell member can be formed. Surrounding a portion of the shell member, the first dielectric layer can be formed over the doped buffer layer. Surrounding another portion of the shell member, the metal gate can be formed over the first dielectric layer. Surrounding an additional portion of the shell member, the second dielectric layer can be formed over a portion of the metal gate.

According to various embodiments, the nanowire and/or larger, post-based HEMTs, and their arrays can be used in various devices including, but not limited to, cell phones, direct broadcast satellite receivers, and/or radars.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for making a HEMT comprising:
epitaxially growing a III-N based nanowire through a growth mask from a first portion of a doped buffer layer;
forming a shell member surrounding a length of the III-N based nanowire for forming a two-dimensional electron gas (2-DEG) at an interface between the III-N based nanowire and the shell member, the shell member being disposed over a second portion of the doped buffer layer;
forming a first dielectric layer surrounding a first portion of the shell member and over a third portion of the doped buffer layer;
forming a metal gate surrounding a second portion of the shell member and over the first dielectric layer; and
forming a second dielectric layer surrounding a third portion of the shell member and over a portion of the metal gate.

2. The method of claim 1, further comprising,
forming a source contact on the III-N based nanowire; and
forming a drain contact on the doped buffer layer opposite to the III-N based nanowire.

3. The method of claim 1, wherein epitaxially growing the III-N based nanowire comprises a selective growth of the III-N based nanowire followed by a pulsed growth of the III-N based nanowire.

4. The method of claim 3, wherein forming the shell member surrounding the length of the III-N based nanowire comprises adding trimethyl aluminum to an MOCVD (metalorganic chemical vapour deposition) gas mixture containing trimethylgallium (TMGa), and ammonia ($NH_3$) during the pulsed growth.

5. A method for making a HEMT transistor array according to claim 1, further comprising:
epitaxially growing a plurality of III-N based nanowires through the growth mask from the doped buffer layer;
forming a shell member surrounding a length of each nanowire of the plurality of III-N based nanowires for forming a two-dimensional electron gas (2-DEG) at an interface between each III-N based nanowire and the shell member,
forming the first dielectric layer surrounding a first portion of each shell member and over the doped buffer layer;
forming the metal gate surrounding a second portion of each shell member and over the first dielectric layer; and
forming the second dielectric layer surrounding a third portion of each shell member and over a portion of the metal gate.

6. A method for making a HEMT comprising:
forming a III-N based post over a first portion of a doped buffer layer, wherein the III-N based post has a minor cross-sectional dimension of greater than about 250 nm;
forming a shell member surrounding a length of the III-N based post for forming a two-dimensional electron gas (2-DEG) at an interface between the III-N based post and the shell member, the shell member being disposed over a second portion of the doped buffer layer;
forming a first dielectric layer surrounding a first portion of the shell member and over a third portion of the doped buffer layer;
forming a metal gate surrounding a second portion of the shell member and over the first dielectric layer; and
forming a second dielectric layer surrounding a third portion of the shell member and over a portion of the metal gate.

7. The method of claim 6, further comprising,
forming a source contact on the III-N based post; and
forming a drain contact having the doped buffer layer disposed there on.

8. The method of claim 6, wherein forming the III-N based post over the first portion of the doped buffer layer comprises,
forming a III-N based layer over the doped buffer layer; and
top-down etching the III-N based layer to form the III-N based post having a length and a cross-sectional shape.

9. A method for making a HEMT transistor array according to claim 6, further comprising:
forming a plurality of III-N based posts over the doped buffer layer;
wherein each post of the plurality of III-N based posts has a minor cross-sectional dimension of greater than about 250;
forming a shell member surrounding a length of each post of the plurality of III-N based posts for forming a two-dimensional electron gas (2-DEG) at an interface between each III-N based nanowire and the shell member,
forming the first dielectric layer surrounding a first portion of each shell member over the doped buffer layer;
forming a metal gate surrounding a second portion of each shell member and over the first dielectric layer; and
forming a second dielectric layer surrounding a third portion of each shell member and over a portion of the metal gate.

* * * * *